United States Patent [19]

Green

[11] Patent Number: 5,584,935
[45] Date of Patent: Dec. 17, 1996

[54] PROCESS AND APPARATUS FOR THE DEPOSITION OF THIN ELECTROCHROMIC LAYERS FORMED OF MATERIALS WITH A STOICHIOMETRIC COMPOSITION

[75] Inventor: Mino Green, London, United Kingdom

[73] Assignee: Societa Italiana Vetro - SIV - S.p.A., San Salvo Chieti, Italy

[21] Appl. No.: 431,960

[22] Filed: May 1, 1995

[30] Foreign Application Priority Data

May 13, 1994 [IT] Italy ................ RM94A0295

[51] Int. Cl.$^6$ ................ C23C 14/00
[52] U.S. Cl. ................ 118/726
[58] Field of Search ................ 118/726

[56] References Cited

U.S. PATENT DOCUMENTS

| 5,051,274 | 9/1991 | Goldner et al. ................ 427/109 |
| 5,073,011 | 12/1991 | Ito et al. ................ 359/265 |

FOREIGN PATENT DOCUMENTS

| 0078464 | 5/1983 | European Pat. Off. . |
| 0408427 | 1/1991 | European Pat. Off. . |
| 0568457 | 11/1993 | European Pat. Off. . |
| 2582319 | 11/1986 | France . |

OTHER PUBLICATIONS

Patent Abstracts of Japan, vol. 008, No. 218 (C-245) Oct. 4, 1994.

NTZ Nachrichtentechnische Zeitschrift, vol. 28, 1975 Berlin, DE, pp. 196-200.

Primary Examiner—Richard Bueker
Attorney, Agent, or Firm—Wenderoth, Lind & Ponack

[57] ABSTRACT

Thin layers forming an active coloring electrode in an electrochromic cell, in particular in electrochromic glass for use in buildings and vehicles, are produced by vacuum evaporation of metal oxides in an apparatus in which the flow of the vapour to the substrate to be coated follows a path that avoids any direct contact with the electrical resistances providing the heat required for evaporation, so as to obtain said thin layers in a stoichiometric composition with respect to the ideal formula of the evaporated oxide; this gives the highest coloring efficiency in the cell (FIG. 1).

10 Claims, 2 Drawing Sheets

PROCESS AND APPARATUS FOR THE DEPOSITION OF THIN ELECTROCHROMIC LAYERS FORMED OF MATERIALS WITH A STOICHIOMETRIC COMPOSITION

BACKGROUND OF THE INVENTION

1. Field of the Invention

The present invention relates to a process and an apparatus for the deposition on a substrate of a thin layer of material having a stoichiometric composition, particularly suited for use as an electrochromic layer with the highest colouring efficiency.

2. Description of the Prior Art

Devices known as electrochromic cells are known from the prior art, and have the ability to change colour when an electric current passes through them, the intensity of the colour being correlated to the total amount of the electric charges transferred.

If said electrochemical electrochromic systems show no parasite chemical reactions inverting colouration autonomously, the coloured layer of the cell will remain intact until an equal amount of charge, of the opposite sign, causes it to invert.

The colouring efficiency of an electrochromic layer is indicated with E, at a particular light wave length L, and is defined as the variation D in optical density OD, per passed charge density unit, that is to say $E(L)=D$ OD/mC cm-2, in which the charge density unit is in millicoulombs (mC) per square centimeter (cm-2) and in which the optical density OD is the base 10 logarithm of the ratio between initial transmittance and the transmittance obtained.

The electrochromic systems can be used as glazing for automobiles and buildings, as large displays for motorway indicator signs or as small tables for shelving units, as devices for use in credit cards or for electrical indicators.

There are also applications for this type of material that do not make use of its colouring properties, but on the contrary make use of their electronic and thermodynamic properties, a typical example of which are thin film batteries or electronic switches.

The electrochromic systems taken into consideration all use at least one electrode which is coated either wholly or partially with a thin layer of metal oxide, called the host metal, which has the ability to change colour when an atom of suitable material, such as lithium, sodium, silver, potassium, magnesium or hydrogen is inserted into said material.

These host materials are typically tungsten trioxide ($WO_3$), or molybdenum trioxide ($MoO_3$) or a solid solution of oxides of these materials alone or together with other oxides of transition metals.

In addition to these colourable host materials there are the so-called counter-electrodes which are colourless or coloured in a complementary manner to the coloured host material.

Thus, for example, a colourless counter-electrode material is vanadium pentoxide ($V_2O_5$). If this counter-electrode contains a monovalent atom such as, for example, lithium at a suitable level of concentration, then the original yellow-green colour is neutralized thanks to the corresponding movement of the absorption band due to the presence of the lithium atom.

The overall chemical composition of this colourless material is $Li_xV_2O_5$.

Another colourless counter-electrode material is a solid solution of $V_2O_5$ and $MoO_3$ at a suitable concentration ratio.

Said thin film counter-electrodes must have a sufficient quantity of contained atoms, for example of lithium, hydrogen, sodium, silver, potassium or magnesium so that when a fraction of these atoms is transferred to the electrode to be coloured to obtain the desired electrochromic change there is no visible change in the appearance of the counter-electrode.

If the atoms are removed until reaching the limit at which the layer becomes coloured, then the resulting change of colour will increase the colour change in the main electrode.

The latter situation can be determined by having a sufficiently thin film so that substantially all the atoms are transferred from the counter-electrode to the main electrode during the colouring phase and vice versa during the decolouring phase, as has been described in the literature (Green, Evans, Hussain, "Optical properties of thin film oxide bronzes for window applications, Second International Symposium on Polymer Electrolytes, Ed. B. Scrosati, Pub. Elsevier Applied Science, London, p449-1989; European patent application No. 0608203).

The layers described above, made up of host material or counter-electrode material, are indicated in the present description as electrochromic layers.

Said electrochromic layers are applied to a number of conductor electrodes, at least one of which is transparent, which are typically plastic or glass coated with doped tin oxide, or a mixture of tin and lithium oxide and in the case of use for glazing purposes all the electrodes are transparent.

In other applications, such as, for example, in credit cards, the transparent electrode can be of plastic material coated with conducting tin oxide and then coated with an electrochromic layer.

The composition and structure of these electrochromic layers is critical for the operation of the electrochromic device.

In fact it is known from the state of the art that the electrochromic material forming said electrochromic layers must be without humidity, with an extremely fine polycrystalline grain and with a stoichiometric composition as described in the English patent applications No. 2081922 and No. 2164466.

SUMMARY OF THE INVENTION

In particular, it has been found that a non-stoichiometric guest material lowers the colouring efficiency E of the device considerably, and furthermore the colouring properties of said material become time dependent. It is therefore of fundamental importance because of the above and for the applications described that electrochromic thin layers be deposited formed by materials with a stoichiometric composition with respect to the evaporated material.

Object of the present invention is therefore to provide a process and an apparatus for the deposition of electrochromic thin layers formed by materials with a stoichiometric composition.

The methods known from the state of the art and commonly used for deposition of thin layers are mainly two, the sputtering method and the vacuum heat evaporation method.

However, the sputtering method, both of a reactive and of a non-reactive type (using radio frequency or using low frequency alternate current) and also of the direct current reactive type, have not been found suitable to obtain stoichiometric material on the substrate as it is difficult to maintain the process stable in the desired conditions and to render these conditions compatible with industrially acceptable deposition speeds. Consequently, the colouring efficiency value E is low.

According to the present invention, using the vacuum evaporation method it is possible to obtain a thin layer with stoichiometric material on a substrate, and thus the highest possible colouring efficiency E, also coating large surfaces such as car windows or windows for buildings in industrially acceptable times.

It has, in fact, been surprisingly discovered that the variation in the stoichiometric composition of the thin layer deposited on the substrate depends on the fact that the evaporated species come into contact with the materials forming the means heating the material to be evaporated.

In fact, when vacuum evaporating oxides such as $WO_3$ or $V_2O_5$ or $MoO_3$ or $Ir_2O_3$ or $Nb_2O_5$, in the absence of humidity, the vapour obtained respects the stoichiometric composition of the initial formula.

The most common method of obtaining heat evaporation in a vacuum system is that of using heating means formed by electrical resistances, made for example of tungsten or molybdenum or tantalum, which are capable of reaching temperatures of 1500 degrees Centigrade and over without significant evaporation, also using high intensity, low voltage plants that are not excessively expensive.

When the vapour, which has a stoichiometric composition, comes into contact with the hot metals forming these resistances, a process of chemical reduction takes place, giving rise to deposited materials that have a sub-stoichiometric composition and, consequently, a low colouring efficiency E.

Object of the present invention is therefore a process for the deposition on a substrate of one or more thin layers showing on said substrate a stoichiometric composition, said layers being particularly useful as electrochromic layers showing the highest colouring efficiency in an electrochromic cell, characterized in that the depositing operation takes place by means of an operation of depositing a metal oxide on said substrate by vacuum evaporation of said oxide by means of heat produced by heating means, in which the flow of oxide vapour to said substrate follows a path in which any direct contact of the vapour with said heating means is avoided.

A further object of the present invention is an apparatus for the deposition on a substrate of one or more thin layers having on said substrate a stoichiometric composition, particularly useful as an electrochromic layer having the highest colouring efficiency in an electrochromic cell, by using a process of vacuum evaporation of a metal oxide, characterized in that it comprises: an external refractory housing resistant to impact and mechanical stress with an open top and having inner surfaces; a metal sheet conductive member placed along said inner surfaces of the housing and along the upper rim of the top thereof, and showing an electrical resistance for producing heat on connection to an electric power supply; a container inside said housing having an open top and being externally in heat transmission contact with said conductive member and containing said metal oxide to be evaporated, said container having its top rim at a level higher than the portion of said conductive sheet member which is placed along the top rim of said external housing, so that the flow of oxide vapour directed to said substrate is inhibited from coming into contact with said sheet metal member, whereby the thin oxide layer deposited on said substrate shows a composition which is stoichiometric with respect to said oxide to be evaporated contained in said container.

BRIEF DESCRIPTION OF THE DRAWINGS

Further characteristics and advantages of the present invention will be clear from the following description, given merely as a non-limiting examples and referring to the enclosed drawings, in which.

DESCRIPTION OF THE PREFERRED EMBODIMENT

Figure 1:
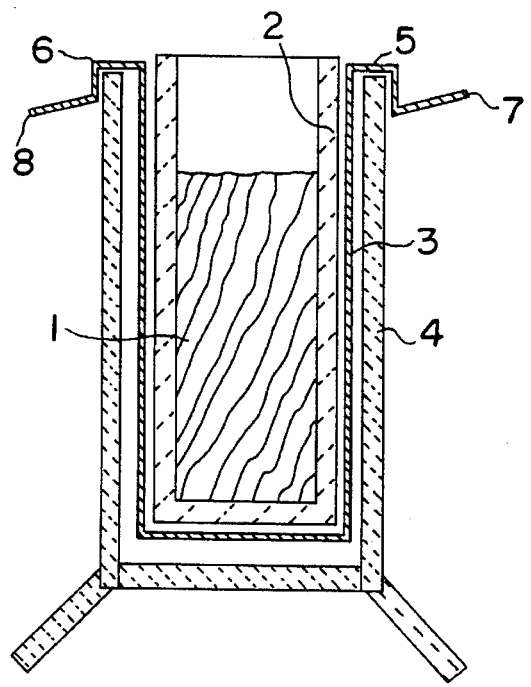
FIG. 1 is a vertical cross-section view of an apparatus according to the present invention.

With reference to FIG. 1, a crystal container 2 of a suitable and pre-defined height, closed at the base and open at the top, is filled to approximately three quarters of its capacity with a suitable metal oxide 1. The material 1 and the container 2 form the source of evaporation.

The heating means are made up of a strip of molybdenum 3 placed inside an alumina container (4) supporting the electrical resistance 3 and forming the housing for the device.

The layer of molybdenum 3 is bent over the ends of the alumina housing 4 and the ends 5 and 6 are connected to a source of electricity not shown in the figure, supplied by means of cables 7 and 8.

The whole apparatus is placed under a vacuum by means not shown in the figure; the substrate onto which the layer is deposited and the means for keeping the apparatus itself in position are likewise not shown in the figure.

Heating and evaporation of the oxide 1 takes place thanks to the heat generated by the resistance 3. The portion of the molybdenum resistance that is curved over and covers the alumina housing 4 ensures that the top of the container 4 is hotter than any other part of the system, thus ensuring that the material evaporating does not condense on the inner edges of the crystal container 2.

The container 2 containing the material 1 is arranged in such a way that the material evaporating cannot come into contact with the molybdenum resistance, thanks to the fact that said container 2 has its lip or rim at a level higher than that of the resistance 3. In this way, the flow of vapour is deposited on the cold substrate as material with a stoichiometric composition. If the mouth of the container had been below the level of the molybdenum resistance 3 the material condensing on the substrate would not have been stoichiometric, and therefore the electrochromic layers would have had a colouring efficiency level E lower than maximum.

Figure 2:
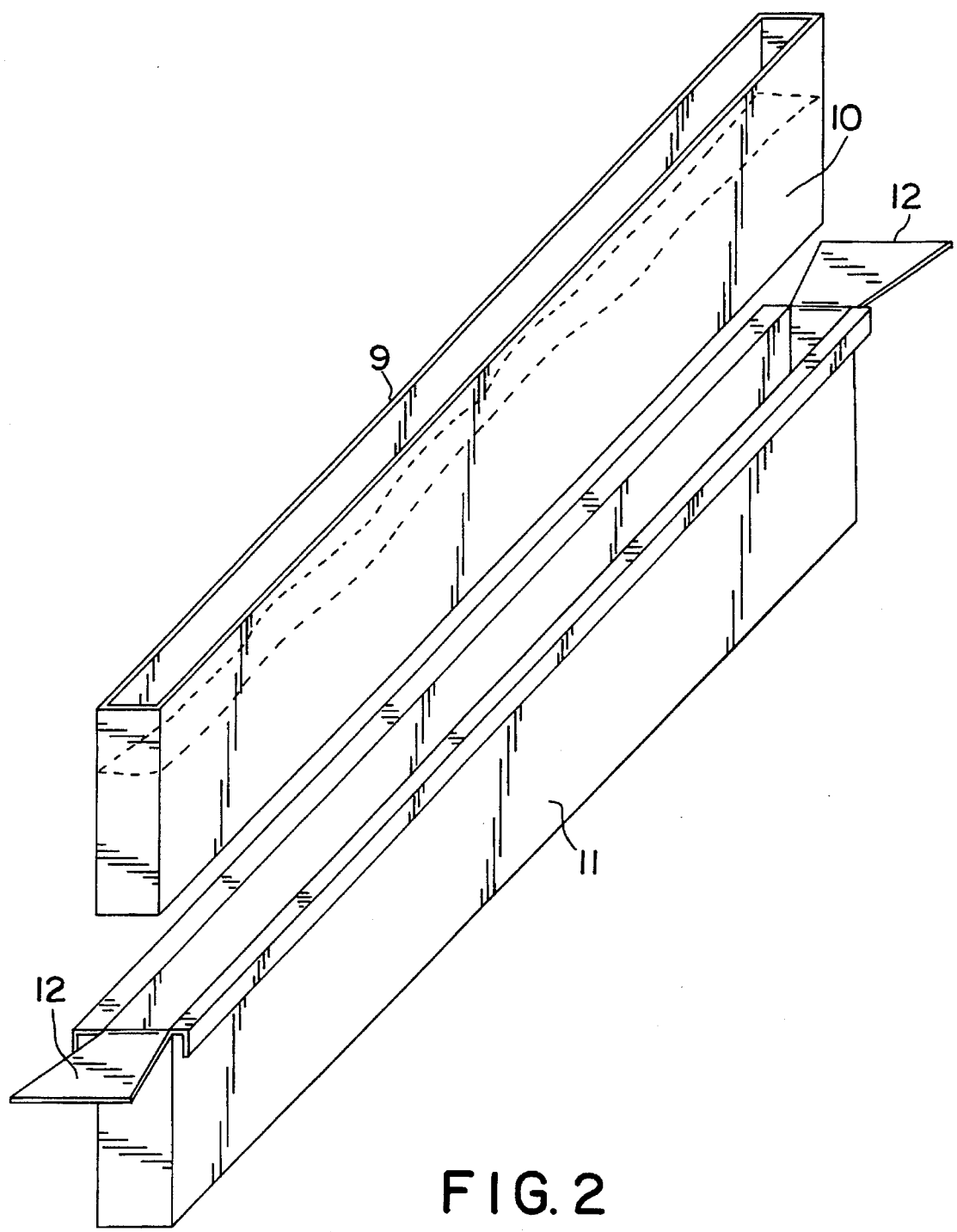
FIG. 2 is an overall, exploded view of the apparatus shown in FIG. 1.

FIG. 2 shows an overall exploded view of the apparatus according to the invention, particularly suitable to be used to deposit thin electrochromic layers on sheets of glass with large surface areas.

Naturally, the size will depend on the application: in the case of manufacture of electrochromic glass the typical size of the surface to be coated is approximately 1 meter wide. Representatives of inner sizes of the apparatus are: 12 mm width, 40 mm depth, about 1100 mm length (when the surface to be coated is 1 meter long). The opening of the apparatus is so shaped as to allow a major amount of evaporated material to pass by the ends and a minor amount through the remaining area. This enables a uniform coating quantity to be applied along the substrate, so avoiding the lower coating quantity apparently occurring at the ends of the substrate. In this case also the container 9 holding the material to be evaporated 10 is placed at a level higher than the resistances 11, so as to avoid direct contact of the vapor with the electrical resistances. The upper edges of the resistance 11 is shaped like an U, in order to cover the edges of the housing, which is not shown in the figure.

The electrical resistances 11 have metal tongues 12 which are connected to a power source, so that the current flows from one end to the other, heating the material to be evaporated in a uniform manner.

Supports and other means to hold the device in position are not shown in the figure, nor are the substrate and the container surrounding the device itself to maintain the vacuum illustrated.

Figure 3:
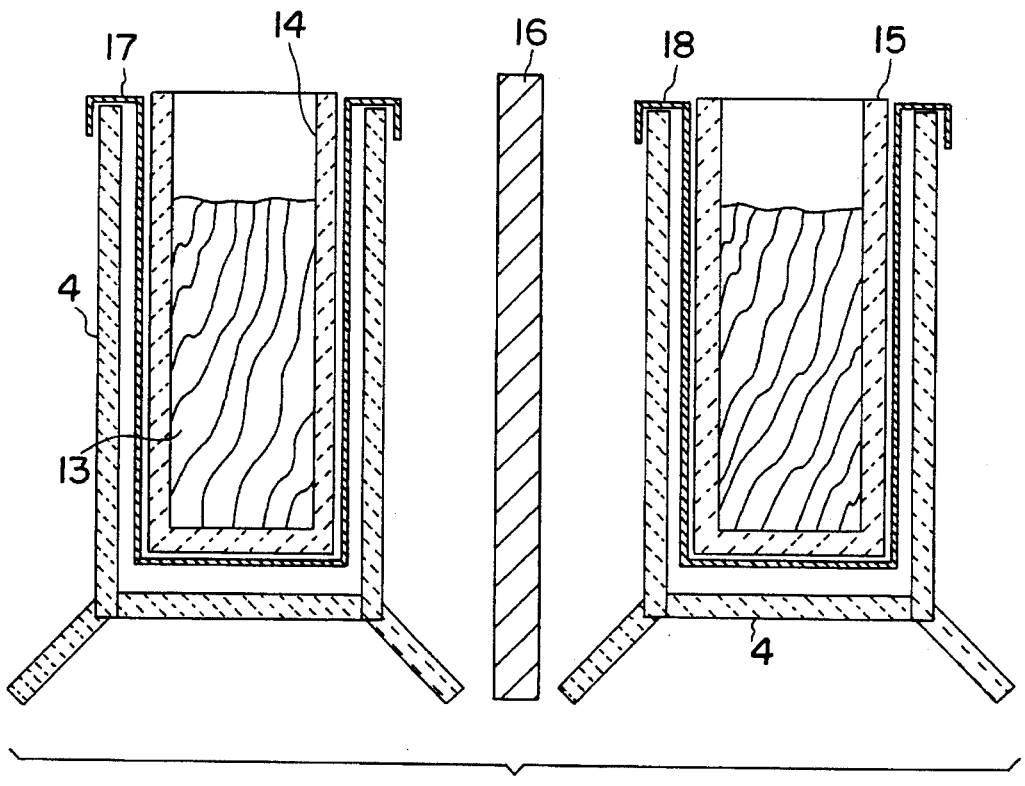
FIG. 3 is a vertical cross-section view of two apparatuses according to FIG. 1, placed side-by-side.

In FIG. 3 an example of application of the apparatus according to the present invention is shown, capable of depositing thin layers having stoichiometric compositions and obtained with a mixture of oxides or with an oxide and a suitable metal.

In fact, two groups of similar apparatuses are placed side by side and contained in the same vacuum container, the first containing for example MoO3 and the second V2O5, so that the thin layer deposited by heat evaporation has a composition which is a mixture of the two oxides.

According to the present invention the containers 14 and 15 have their lip at a level above that of the heating resistances 17 and 18, and furthermore they have a screen 16 with its top at a level such as to keep the two vapours separate, so as to prevent them from coming into contact with the resistances 17 and 18.

The material forming the screen 16 is preferably formed of chemically inert material such as ceramic or metal at a temperature sufficiently low that it does not react with the vapour.

In a further embodiment of the present invention the material 13 in container 14 is V2O5 and the material present in container 15 is metallic lithium.

Through the effect of vacuum heat evaporation and by means of the apparatus according to the present invention and placed side by side and separated by a screen 16, an electrochromic layer is deposited with a stoichiometric composition and which also acts as a counter-electrode containing a guest atom.

Although the invention has been described with reference to a preferred embodiment thereof, variations and modifications may be made thereto without departing from the spirit and the scope of the invention itself.

I claim:

1. Apparatus for the deposition on a substrate of one or more thin layers having on said substrate a stoichiometric composition, particularly useful as an electrochromic layer showing having the highest colouring efficiency in an electrochromic cell, by using a process of vacuum evaporation of a metal oxide, comprising: an external refractory housing resistant to impact and mechanical stress with an open top and having inner surfaces; a metal sheet conductive member placed along said inner surfaces of the heating housing and along the upper rim of the top thereof, and showing an electrical resistance for producing heat on connection to an electric power supply; a container inside said housing having an open top and being externally in heat transmission contact with said conductive member and containing said metal oxide to be evaporated, said container having its top rim at a level higher than the portion of said conductive sheet member which is placed along the top rim of said external housing, so that the flow of oxide vapour directed to said substrate is inhibited from coming into contact with metal sheet heating member, whereby the thin oxide layer deposited on said substrate shows a composition which is stoichiometric with respect to said oxide to be evaporated contained into said container.

2. Apparatus according to claim 1, in which the end portions of said metal sheet heating member are bent around said external housing.

3. Apparatus according to claim 1, in which the metal sheet heating member is formed of molybdenum or tungsten or tantalium.

4. Apparatus according to claim 3 in which the external housing is made of alumina.

5. Apparatus according to claim 1, in which said oxide metal mixtures comprise $MoO_3$ and $V_2O_5$.

6. Apparatus according to claim 1, comprising two or more groups of housing, container and conductive member each group containing said oxides or mixtures thereof with themselves or with transition metal oxides or metals to be evaporated, said groups been separated by a separating shield to inhibit said vapour from coming into contact with said conductive member of another said group, so as to produce thin layers having a stoichiometric composition of said mixtures.

7. Apparatus according to claim 6, in which said metals are selected from the group comprising lithium, sodium, potassium, magnesium, hydrogen or silver.

8. Apparatus according to claim 6, in which said separating shield is made of a chemically inert material of ceramic type or of a metal at a low temperature.

9. Apparatus according to claim 2, in which the metal sheet heating member is formed of molybdenum or tungsten or tantalium.

10. Apparatus according to claim 7, in which said separating shield is made of a chemically inert material of ceramic type or of a metal at a low temperature.

* * * * *